(12) United States Patent
Chung et al.

(10) Patent No.: US 12,154,889 B2
(45) Date of Patent: Nov. 26, 2024

(54) SEMICONDUCTOR PACKAGE

(71) Applicant: SAMSUNG ELECTRONICS CO., LTD., Suwon-si (KR)

(72) Inventors: Hyunsoo Chung, Hwaseong-si (KR); Taewon Yoo, Seoul (KR); Myungkee Chung, Hwaseong-si (KR); Jinchan Ahn, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 107 days.

(21) Appl. No.: 17/370,594

(22) Filed: Jul. 8, 2021

(65) Prior Publication Data

US 2022/0216190 A1 Jul. 7, 2022

(30) Foreign Application Priority Data

Jan. 4, 2021 (KR) ........................ 10-2021-0000207

(51) Int. Cl.
| | |
|---|---|
| *H01L 23/64* | (2006.01) |
| *H01L 23/00* | (2006.01) |
| *H01L 23/498* | (2006.01) |
| *H01L 25/10* | (2006.01) |

(52) U.S. Cl.
CPC ...... *H01L 25/105* (2013.01); *H01L 23/49811* (2013.01); *H01L 23/49833* (2013.01); *H01L 24/20* (2013.01); *H01L 2224/2101* (2013.01)

(58) Field of Classification Search
CPC ...... H01L 23/642; H01L 23/29; H01L 23/485
See application file for complete search history.

(56) References Cited

U.S. PATENT DOCUMENTS

| | | |
|---|---|---|
| 6,847,066 B2 | 1/2005 | Tahara et al. |
| 7,002,248 B2 | 2/2006 | Akram et al. |
| 7,274,097 B2 | 9/2007 | Baek et al. |
| 7,858,441 B2 | 12/2010 | Lin et al. |
| 7,888,803 B2 | 2/2011 | Kariya et al. |
| 8,736,066 B2 | 5/2014 | Oganesian et al. |
| 9,257,409 B2 | 2/2016 | Tzeng et al. |
| 9,331,057 B2 | 5/2016 | Meyer et al. |
| 9,368,563 B2 | 6/2016 | Lin et al. |
| 9,472,425 B2 | 10/2016 | Song et al. |

(Continued)

*Primary Examiner* — Michele Fan
(74) *Attorney, Agent, or Firm* — Myers Bigel, P.A.

(57) ABSTRACT

Disclosed is a semiconductor package comprising a semiconductor chip and a redistribution layer. The semiconductor chip includes a semiconductor substrate, a passivation layer, and first power, second power, and signal pads exposed from the passivation layer. The redistribution layer includes a photosensitive dielectric layer, and first to third redistribution patterns and a high-k dielectric pattern that are in the photosensitive dielectric layer. The first, second, and third redistribution patterns are respectively connected to the first power, second power, and signal pads. The high-k dielectric pattern is between the first and second redistribution patterns. The photosensitive dielectric layer includes a first dielectric material. The high-k dielectric pattern includes a second dielectric material whose dielectric constant greater than that of the first dielectric material. The high-k dielectric pattern is in contact with the passivation layer. The passivation layer includes a dielectric material different from the first and second dielectric materials.

20 Claims, 10 Drawing Sheets

(56) References Cited

U.S. PATENT DOCUMENTS

| | | | |
|---|---|---|---|
| 9,704,796 B1 | 7/2017 | Gu et al. | |
| 10,522,615 B2* | 12/2019 | Ajuria | H01L 24/12 |
| 2005/0012217 A1* | 1/2005 | Mori | H01L 23/49827 |
| | | | 257/E23.062 |
| 2007/0296010 A1* | 12/2007 | Su | H01L 29/66181 |
| | | | 257/E21.396 |
| 2008/0073110 A1* | 3/2008 | Shioga | H01L 23/498 |
| | | | 174/258 |
| 2009/0079043 A1* | 3/2009 | Hasegawa | H01L 23/3135 |
| | | | 438/123 |
| 2019/0103680 A1* | 4/2019 | Liao | H01Q 21/0087 |
| 2019/0341360 A1 | 11/2019 | Yu et al. | |
| 2020/0020644 A1* | 1/2020 | Lee | G06F 30/398 |
| 2022/0148972 A1* | 5/2022 | Chen | H01L 22/34 |

\* cited by examiner

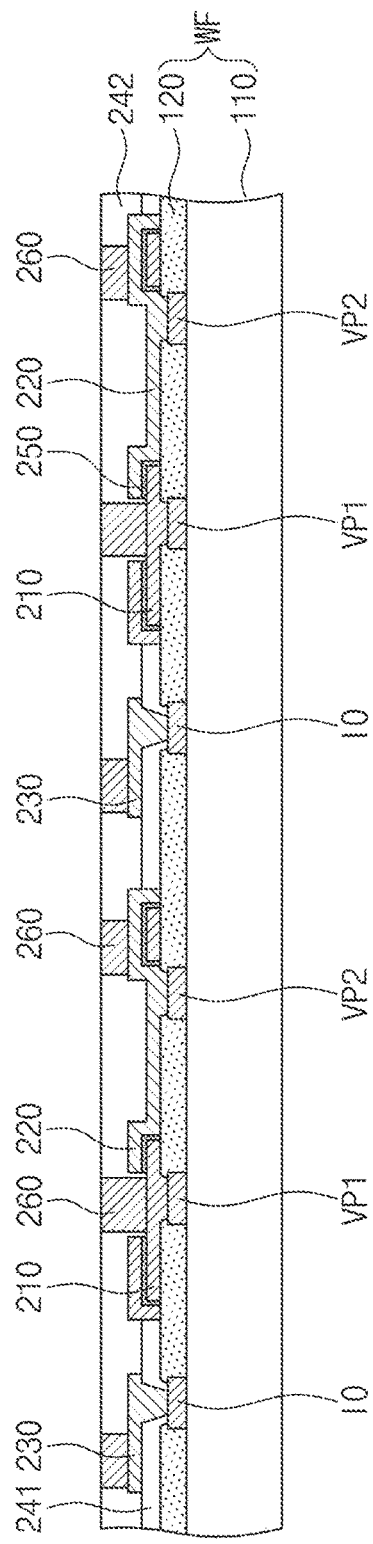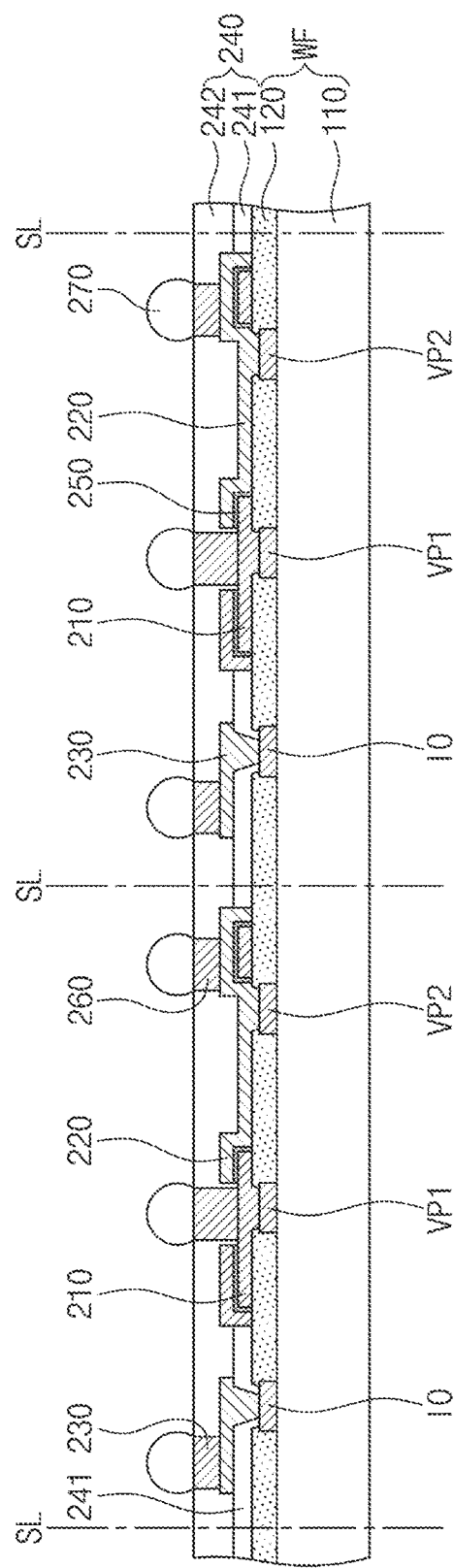

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0000207 filed on Jan. 4, 2021 in the Korean Intellectual Property Office, the disclosure of which is hereby incorporated by reference in its entirety.

BACKGROUND

The present inventive concepts relate to a semiconductor package.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some embodiments of the present inventive concepts provide a semiconductor package with increased reliability.

According to some embodiments of the present inventive concepts, a semiconductor package may include a semiconductor chip, and a redistribution layer on a surface of the semiconductor chip. The semiconductor chip may include a semiconductor substrate, a passivation layer between the semiconductor substrate and the redistribution layer, and a first power pad, a second power pad, and a signal pad that are in the passivation layer. The redistribution layer may include a photosensitive dielectric layer, and a first redistribution pattern, a second redistribution pattern, a third redistribution pattern, and a high-k dielectric pattern. The first redistribution pattern may be electrically connected to the first power pad. The second redistribution pattern may be electrically connected to the second power pad. The third redistribution pattern may be electrically connected to the signal pad. The high-k dielectric pattern may be between the first redistribution pattern and the second redistribution pattern. The photosensitive dielectric layer may include a first dielectric material. The high-k dielectric pattern may include a second dielectric material. A second dielectric constant of the second dielectric material may be greater than a first dielectric constant of the first dielectric material. The high-k dielectric pattern may be in contact with the passivation layer. The passivation layer may include a third dielectric material that is different from the first dielectric material and the second dielectric material.

According to some embodiments of the present inventive concepts, a semiconductor package may include a semiconductor chip, and a redistribution layer on a surface of the semiconductor chip. The semiconductor chip may include a semiconductor substrate, a passivation layer between the semiconductor substrate and the redistribution layer, and a first power pad, a second power pad, and a signal pad that are in the passivation layer. The redistribution layer may include a photosensitive dielectric layer, and a first redistribution pattern, a second redistribution pattern, a third redistribution pattern, and a high-k dielectric pattern. The first redistribution pattern may be electrically connected to the first power pad. The second redistribution pattern may be electrically connected to the second power pad. The third redistribution pattern may be electrically connected to the signal pad. The high-k dielectric pattern may be between the first redistribution pattern and the second redistribution pattern. The photosensitive dielectric layer may include a first dielectric material. The high-k dielectric pattern may include a second dielectric material. A second dielectric constant of the second dielectric material may be greater than a first dielectric constant of the first dielectric material. The third redistribution pattern may include a via part in contact with the signal pad, and a line part on the via part and vertically spaced apart from the signal pad and the passivation layer. An distance between the line part and the passivation layer may be greater than a thickness of the high-k dielectric pattern.

According to some embodiments of the present inventive concepts, a semiconductor package may include a first sub-package, and a second sub-package on the first sub-package. The first sub-package may include a lower redistribution substrate, a semiconductor chip on the lower redistribution substrate, an upper redistribution substrate vertically spaced apart from the lower redistribution substrate and on an opposite side of the semiconductor chip, and a conductive pillar between the lower redistribution substrate and the upper redistribution substrate. The semiconductor chip may include a semiconductor substrate, a passivation layer between the semiconductor substrate and the lower redistribution substrate, and a first power pad, a second power pad, and a signal pad that are in the passivation layer. The lower redistribution substrate may include a photosensitive dielectric layer, and a first redistribution pattern, a second redistribution pattern, a third redistribution pattern, and a high-k dielectric pattern. The first redistribution pattern may be electrically connected to the first power pad. The second redistribution pattern may be electrically connected to the second power pad. The third redistribution pattern may be electrically connected to the signal pad. The high-k dielectric pattern may be between the first redistribution pattern and the second redistribution pattern. The photosensitive dielectric layer may include a first dielectric material. The high-k dielectric pattern may include a second dielectric material. A second dielectric constant of the second dielectric material is greater than a first dielectric constant of the first dielectric material. The first redistribution pattern may include an upper first redistribution pattern in contact with the first power pad, and a lower first redistribution pattern below the upper first redistribution pattern. The second redistribution pattern may include: an upper second redistribution pattern in contact with the second power pad, and a lower second redistribution pattern below the upper second redistribution pattern. The high-k dielectric pattern may overlap a portion of the upper first redistribution pattern. The upper second redistribution pattern may overlap the high-k dielectric pattern. The lower first redistribution pattern may include a first via part in contact with the upper first redistribution pattern, and a first line part connected to the first via part and spaced apart from the upper second redistribution pattern. The lower second redistribution pattern may include a second via part in contact with the upper second redistribution pattern; and a second line part connected to the second via part and spaced apart from the upper second redistribution pattern. A thickness of the first via part may be greater than a thickness of the second via part.

BRIEF DESCRIPTION OF THE DRAWINGS

FIGS. 3 to 10 illustrate cross-sectional views showing a method of fabricating a semiconductor package according to some embodiments of the present inventive concepts.

DETAILED DESCRIPTION

The following will now describe in detail a semiconductor package substrate and a semiconductor package including the same in conjunction with the accompanying drawings.

Figure 1:
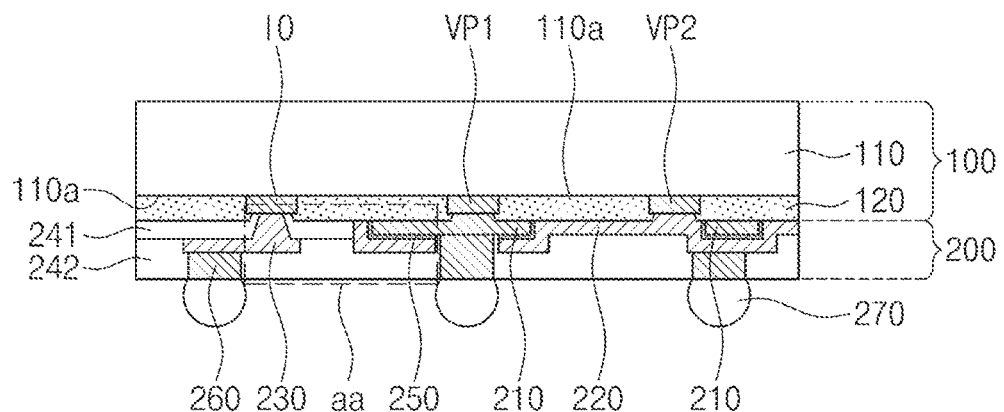
FIG. 1 illustrates a cross-sectional view showing a semiconductor package according to some embodiments of the present inventive concepts.

FIG. 1 illustrates a cross-sectional view showing a semiconductor package according to some embodiments of the present inventive concepts.

Referring to FIG. 1, a semiconductor package 1 according to the present inventive concepts may be a fin-in package. The semiconductor package 1 may include a semiconductor chip 100 and a redistribution layer 200 on the semiconductor chip 100. The semiconductor chip 100 may be a memory device, a logic device (e.g., microprocessor, analog device, digital signal processor), or a multifunctional semiconductor chip such as system-on-chip (SOC). The memory device may include, for example, DRAM, SRAM, Flash memory, EEPROM, PRAM, MRAM, or RRAM.

The semiconductor chip 100 may include a semiconductor substrate 110, a passivation layer 120, a first power pad VP1, a second power pad VP2, and a signal pad IO. The first power pad VP1, the second power pad VP2, and the signal pad IO may be provided on one surface 110a of the semiconductor substrate 110. The one surface 110a may be an active surface on which integrated circuits such as transistors are provided. The passivation layer 120 may protect the active surface 110a, and may maintain node separation between the first power pad VP1, the second power pad VP2, and the signal pad IO.

The first power pad VP1 may be connected to a power source outside the semiconductor package 1, and the second power pad VP2 may be connected to a ground outside the semiconductor package 1. In some embodiments, the first power pad VP1 may be connected to a ground outside the semiconductor package 1, and the second power pad VP2 may be connected to a power source outside the semiconductor package 1. The signal pad IO may be connected to and communicate signals with a circuit structure outside the semiconductor package 1. The first and second power pads VP1 and VP2 and the signal pad IO may include a metallic material. The passivation layer 120 may include, for example, silicon nitride (SiNx).

The redistribution layer 200 may be provided on the passivation layer 120, the first and second power pads VP1 and VP2, and the signal pad IO. The redistribution layer 200 may include a first photosensitive dielectric layer 241, a second photosensitive dielectric layer 242, a first redistribution pattern 210, a second redistribution pattern 220, a third redistribution pattern 230, a high-k dielectric pattern 250, and an external connection pad 260.

The first photosensitive dielectric layer 241 and the second photosensitive dielectric layer 242 may be sequentially stacked on the passivation layer 120. The first photosensitive dielectric layer 241 and the second photosensitive dielectric layer 242 may be a single layer. The first photosensitive dielectric layer 241 and the second photosensitive dielectric layer 242 may include a first dielectric material. The first dielectric material may include a photosensitive polymer, such as photosensitive polyimide, polybenzoxazole, phenolic polymers, and/or benzocyclobutene polymers. The first dielectric material may have a dielectric constant of less than about 4.

The first redistribution pattern 210 and the second redistribution pattern 220 may be provided on the passivation layer 120. The first redistribution pattern 210 and the second redistribution pattern 220 may be in contact with the passivation layer 120.

The high-k dielectric pattern 250 may be provided between the first redistribution pattern 210 and the second redistribution pattern 220. The high-k dielectric pattern 250 may include a second dielectric material. The second dielectric material may have a dielectric constant greater than that of the first dielectric material. The second dielectric material may include a material whose dielectric constant is greater than about 20. The second dielectric material may include, for example, one of hafnium dioxide ($HfO_2$), zirconium dioxide ($ZrO_2$), or yttrium oxide ($Y_2O_3$). A capacitor may be formed by the first redistribution pattern 210, the second redistribution pattern 220, and the high-k dielectric pattern 250. The first redistribution pattern 210 and the second redistribution pattern 220 may each serve as an electrode of the capacitor, and the high-k dielectric pattern 250 may serve as a dielectric between the electrodes.

The first dielectric material and the second dielectric material may be different from a dielectric material of the passivation layer 120.

The first redistribution pattern 210 may be electrically connected to the first power pad VP1. The first redistribution pattern 210 may be in contact with the first power pad VP1. The second redistribution pattern 220 may be electrically connected to and in contact with the second power pad VP2. A voltage applied to the first redistribution pattern 210 may be different from that applied to the second redistribution pattern 220.

The third redistribution pattern 230 may be electrically connected to and in contact with the signal pad IO. The first, second, and third redistribution patterns 210, 220, and 230 may not be in contact with each other. The first to third redistribution patterns 210, 220, and 230 may include a metallic material.

Figure 2:
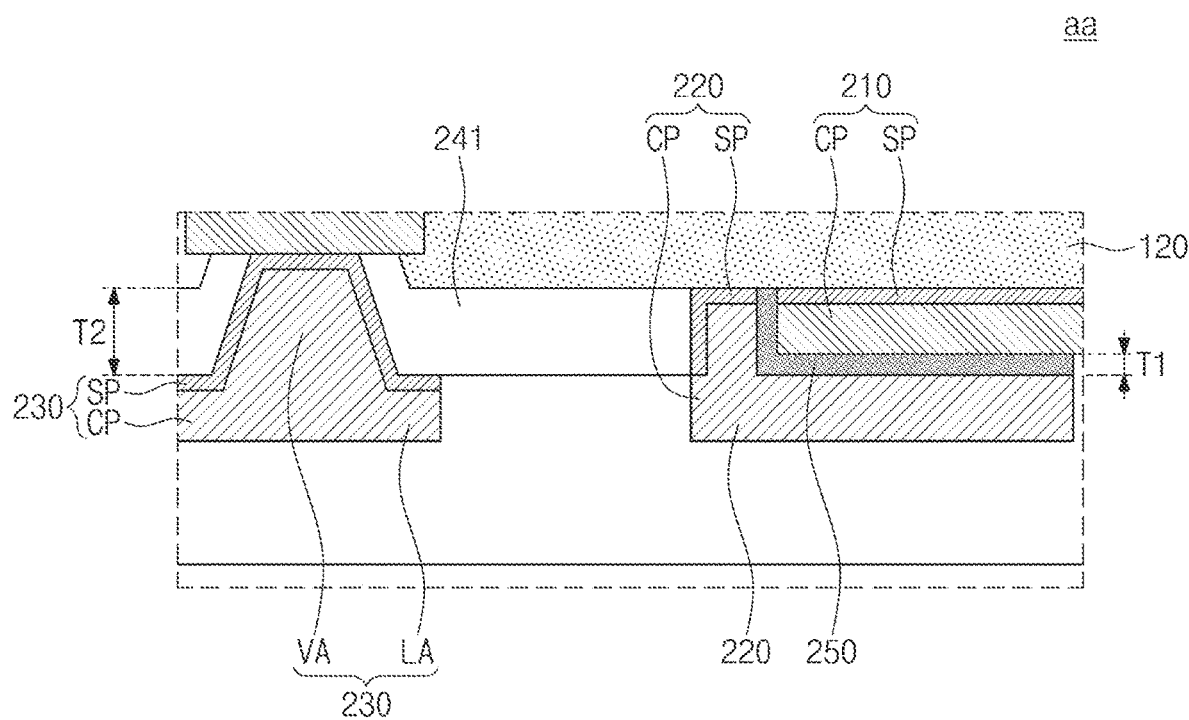
FIG. 2 illustrates an enlarged view showing section aa of FIG. 1.

FIG. 2 illustrates an enlarged view showing section aa of FIG. 1.

Referring to FIGS. 1 and 2, the first, second, and third redistribution patterns 210, 220, and 230 may each include a seed/barrier pattern SP and a conductive pattern CP. The conductive pattern CP may be provided below the seed/barrier pattern SP. The seed/barrier pattern SP may include, for example, copper/titanium (Cu/Ti) The conductive pattern CP may include, for example, copper. The high-k dielectric pattern 250 may be interposed between the conductive pattern CP of the first redistribution pattern 210 and the conductive pattern CP of the second redistribution pattern 220. The high-k dielectric pattern 250 may be in contact with the conductive patterns CP of the first and second redistribution patterns 210 and 220.

The high-k dielectric pattern 250 may have a thickness T1 that is less than or equal to about 1 μm.

The third redistribution pattern 230 may include a via part VA and a line part LA connected to the via part VA. The via part VA may be in contact with the signal pad IO. The line part LA may be vertically spaced apart from the signal pad IO and the passivation layer 120. The line part LA may include a protrusion that extends in a direction parallel to the semiconductor substrate 110. The first photosensitive dielectric layer 241 may be interposed between the line part LA and the passivation layer 120. An interval or distance T2 between the line part LA and the passivation layer 120 may be substantially the same as a thickness T2 of the first photosensitive dielectric layer 241. The interval or distance T2 between the line part LA and the passivation layer 120 may be equal to or greater than about 5 μm.

The thickness T1 of the high-k dielectric pattern 250 may be less than the thickness T2 of the first photosensitive dielectric layer 241.

According to the present inventive concepts, because the first and second redistribution patterns 210 and 220 define a capacitor, there may be no need to separately attach a capacitor to the redistribution layer 200. As the first and second redistribution patterns 210 and 220 are provided therebetween with the high-k dielectric pattern 250 with a small thickness and a high dielectric constant, capacitance of the capacitor may be increased to reduce power noise. In addition, as the third redistribution pattern 230 is provided thereunder with the first photosensitive dielectric layer 241 whose dielectric constant is less than that of the high-k dielectric pattern 250 and whose thickness is greater than that of the high-k dielectric pattern 250, dielectric properties may be increased to reduce signal interference and signal delay.

Moreover, according to the present inventive concepts, the high-k dielectric pattern 250 may extend to contact the passivation layer 120. The capacitor may be formed on a position adjacent to the passivation layer 120 of the semiconductor chip 100. An adhesive force between the second dielectric material of the high-k dielectric pattern 250 and the silicon nitride (SiNx) of the passivation layer 120 may be greater than an adhesive force between the second dielectric material of the high-k dielectric pattern 250 and the first dielectric material of the first and second photosensitive dielectric layers 241 and 242, and thus the capacitor may be formed on the position mentioned above.

Referring back to FIG. 1, respective external connection pads 260 may be provided on each of the first redistribution pattern 210, the second redistribution pattern 220, and the third redistribution pattern 230. Each of the external connection pads 260 may include a conductive material, such as metal. External connection terminals 270 may be provided on corresponding external connection pads 260. The external connection terminals 270 may be, for example, solder balls.

FIGS. 3 to 10 illustrate cross-sectional views showing a method of fabricating a semiconductor package according to some embodiments of the present inventive concepts.

Figure 3:
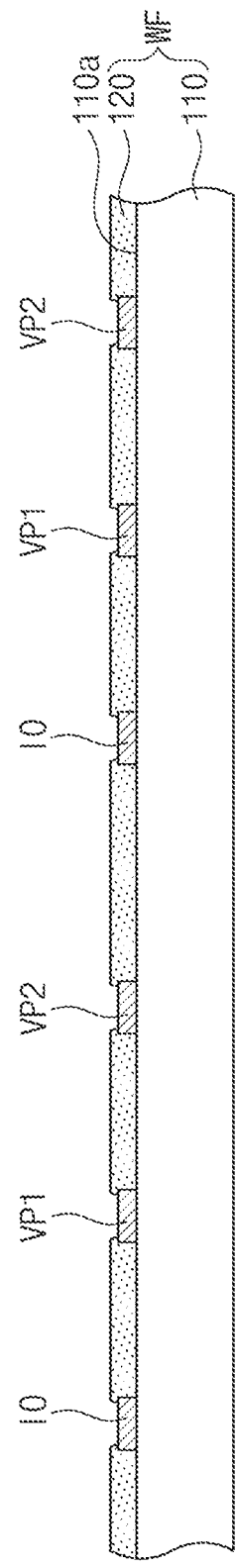

Referring to FIG. 3, a wafer WF may be provided. The wafer WF may include a semiconductor substrate 110, first power pads VP1, second power pads VP2, signal pads IO, and a passivation layer 120. The first and second power pads VP1, VP2, signal pads IO and the passivation layer 120 may be provided on one surface 110a of the semiconductor substrate 110, and the passivation layer 120 may expose the first and second power pads VP1, VP2, and signal pads IO.

Figure 4:
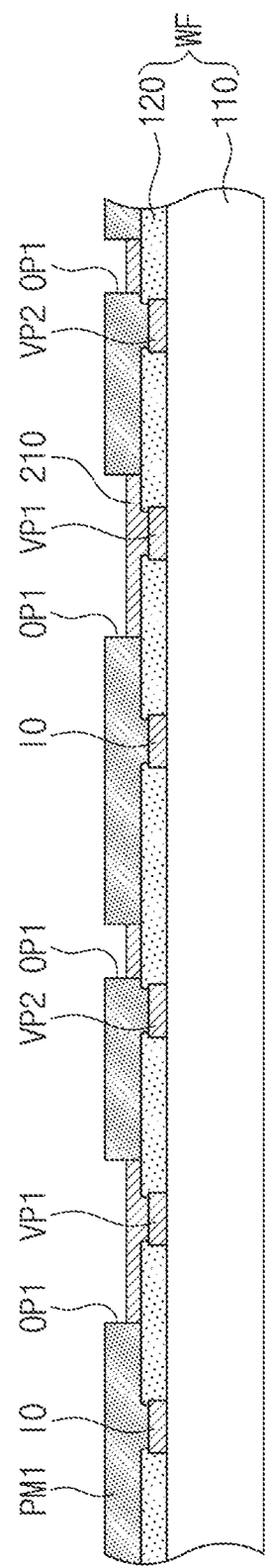

Referring to FIG. 4, a first photomask pattern PM1 may be formed. The first photomask pattern PM1 may be formed by coating, exposing, and/or developing a photoresist material. The first photomask pattern PM1 may include a first opening OP1 that defines a space in which a first redistribution pattern 210 will be formed. An electroplating process may be employed to form the first redistribution pattern 210 in the first opening OP1.

Figure 5:
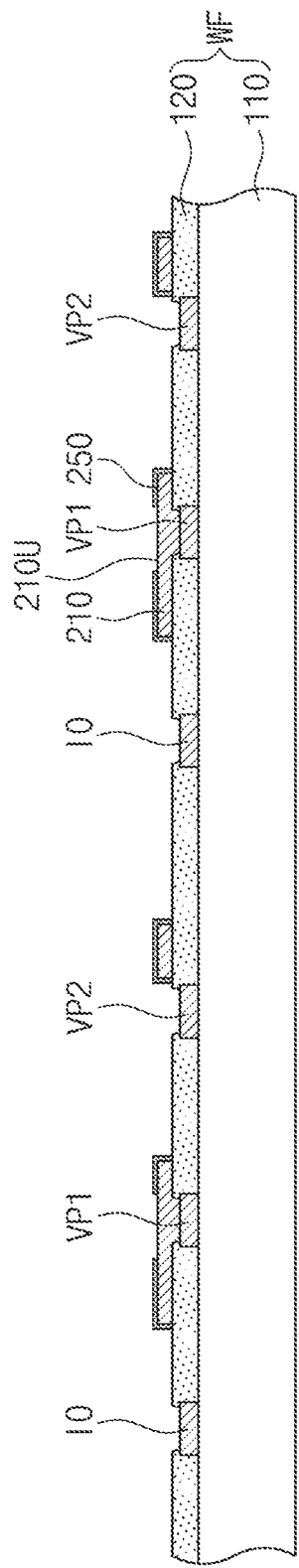

Referring to FIG. 5, the first photomask pattern PM1 may be removed. Afterwards, a high-k dielectric pattern 250 may be formed on the first redistribution pattern 210. A second dielectric material may be formed which is shaped like a conformal layer on the wafer WF, and then an etching process may be performed to etch a portion of the layer to form the high-k dielectric pattern 250. The etching process may partially expose a top surface 210U of the first redistribution pattern 210.

Figure 6:
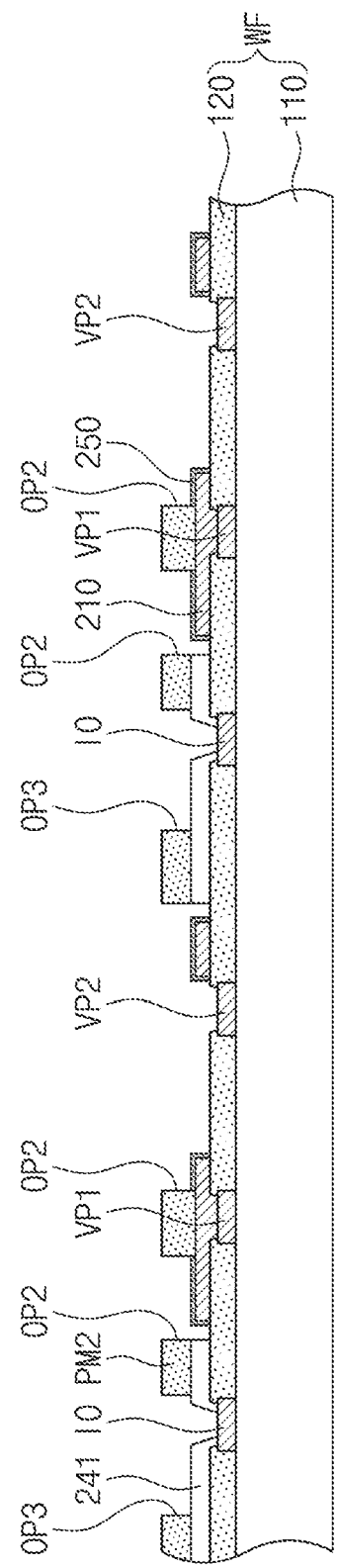

Referring to FIG. 6, a first photosensitive dielectric layer 241 may be formed. The first photosensitive dielectric layer 241 may be formed by coating, exposing, developing, and/or curing a photosensitive dielectric material. A second photomask pattern PM2 may be formed on the first photosensitive dielectric layer 241. The second photomask pattern PM2 may be formed by coating, exposing, and/or developing a photoresist material. The first photosensitive dielectric layer 241 and the second photomask pattern PM2 may include a second opening OP2 that defines a region where a second redistribution pattern 220 will be formed as discussed below, and may also include a third opening OP3 that defines a region where a third redistribution pattern 230 will be formed as discussed below.

Figure 7:
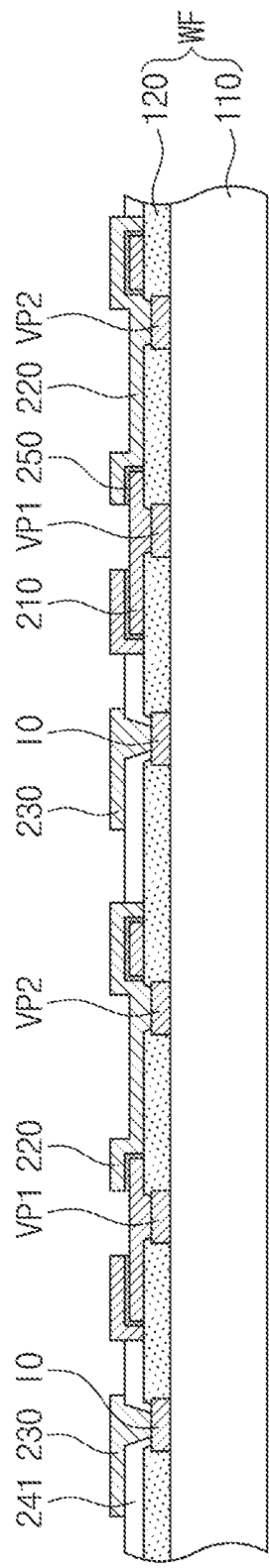

Referring to FIG. 7, a second redistribution pattern 220 and a third redistribution pattern 230 may be formed at the same time. The second redistribution pattern 220 and the third redistribution pattern 230 may be formed by, for example, an electroplating process. Thereafter, the second photomask pattern PM2 may be removed.

Figure 8:
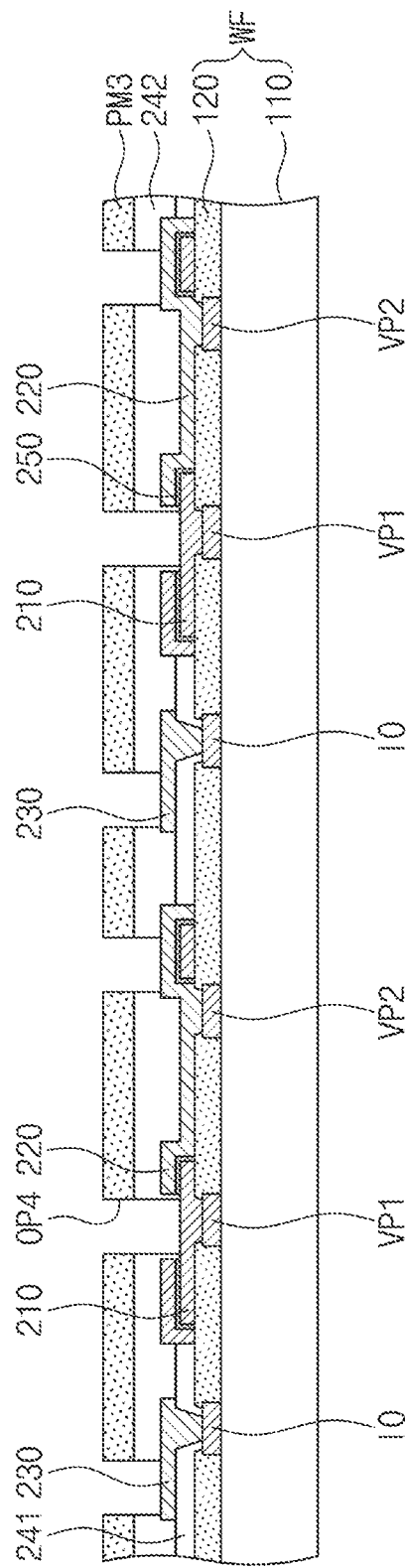

Referring to FIG. 8, a second photosensitive dielectric layer 242 may be formed. The second photosensitive dielectric layer 242 may be formed by coating, exposing, developing, and/or curing a photosensitive dielectric material. After that, a third photomask pattern PM3 may be formed which overlaps the second photosensitive dielectric layer 242. The third photomask pattern PM3 and the second photosensitive dielectric layer 242 may include fourth openings OP4 that expose portions of the first redistribution pattern 210, portions of the second redistribution pattern 220, and portions of the third redistribution pattern 230. The third photomask pattern PM3 may be formed by coating, exposing, and/or developing a photoresist material.

Referring to FIG. 9, external connection pads 260 may be formed on portions of the first, second, and third redistribution patterns 210, 220, and 230. The external connection pads 260 may be formed by an electroplating process.

Referring to FIG. 10, external connection terminals 270 may be formed on corresponding external connection pads 260. The external connection terminals 270 may be formed by, for example, a solder-ball attachment process. Afterwards, a sawing process may be performed along a sawing line SL.

Accordingly, a semiconductor package 1 may be fabricated as shown in FIG. 1.

Figure 11:
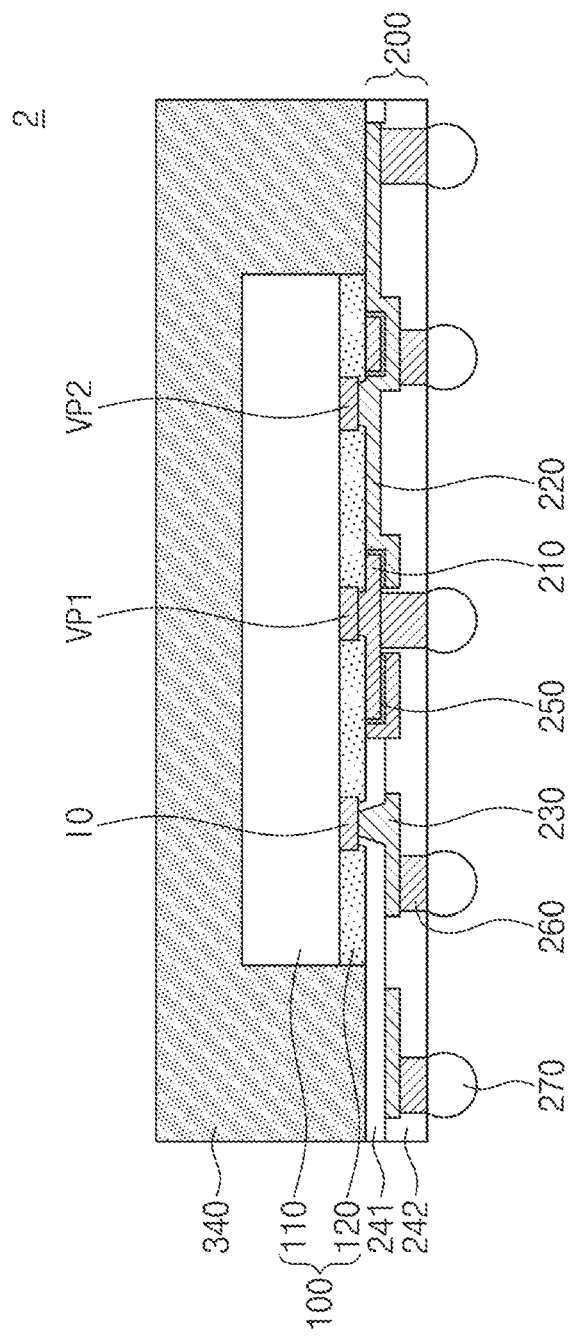
FIG. 11 illustrates a cross-sectional view showing a semiconductor package according to some embodiments of the present inventive concepts.

FIG. 11 illustrates a cross-sectional view showing a semiconductor package according to some embodiments of the present inventive concepts. Omission will be made to avoid a repetitive description given with reference to FIG. 1, except that discussed below.

Referring to FIG. 11, a semiconductor package 2 may be a fan-out package. As shown in FIG. 11, at least one of the external connection terminals 270 may not vertically overlap the semiconductor chip 100.

The redistribution layer 200 may be provided thereon with a molding member 340 that covers or overlaps the semiconductor chip 100. The molding member 340 may include a material, such as epoxy molding compound (EMC).

Figure 12:
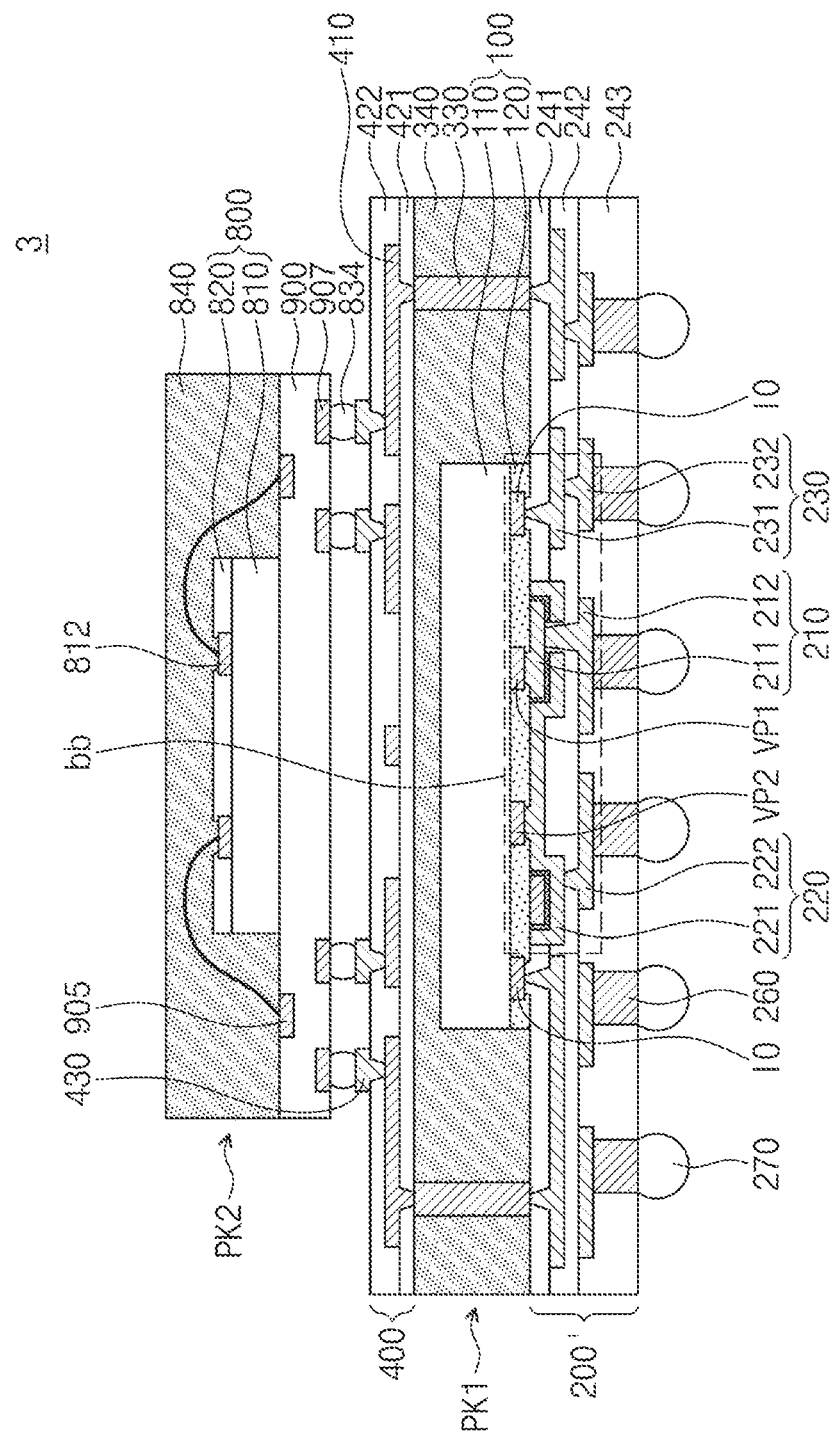
FIG. 12 illustrates a cross-sectional view showing a semiconductor package according to some embodiments of the present inventive concepts.
Figure 13:
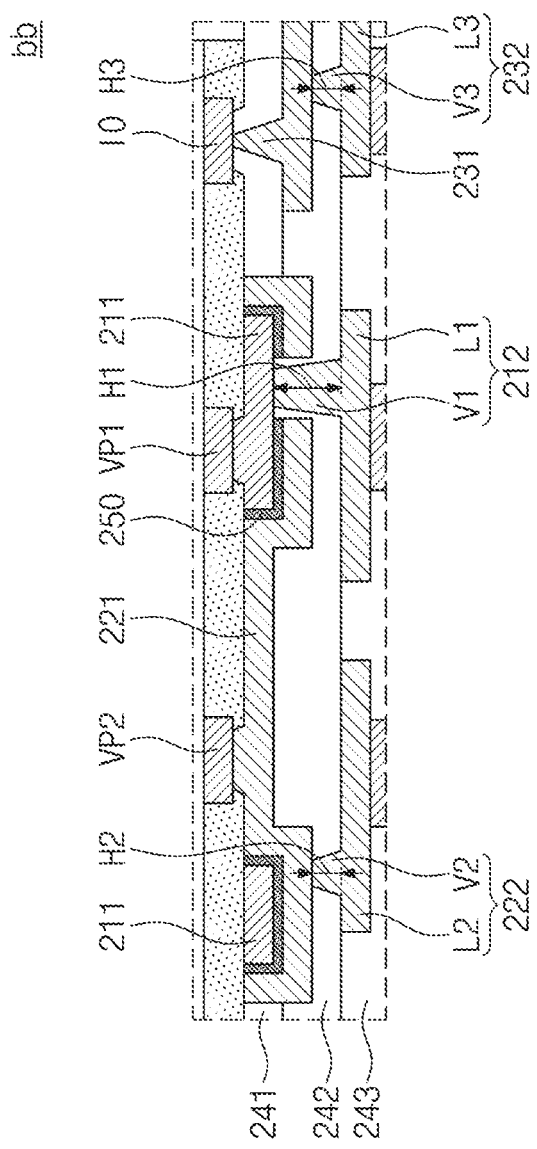
FIG. 13 illustrates an enlarged view showing section bb of FIG. 12.

FIG. 12 illustrates a cross-sectional view showing a semiconductor package according to some embodiments of the present inventive concepts. FIG. 13 illustrates an enlarged view showing section bb of FIG. 12. Omission will be made to avoid a repetitive description given with reference to FIG. 1, except that discussed below.

Referring to FIG. 12, a semiconductor package 3 may include a first sub-semiconductor package PK1 and a second sub-semiconductor package PK2. The semiconductor package 3 may have a package-on-package structure.

The first sub-semiconductor package PK1 may include a lower redistribution substrate 200', a first semiconductor chip 100, an upper redistribution substrate 400, conductive pillars 330, and a first molding member 340.

The lower redistribution substrate 200' may include a first photosensitive dielectric layer 241, a second photosensitive dielectric layer 242, a third photosensitive dielectric layer 243, a first redistribution pattern 210, a second redistribution pattern 220, a third redistribution pattern 230, and external connection pads 260. The lower redistribution substrate 200' may correspond to the redistribution layer 200 of FIG. 1. The first, second, and third photosensitive dielectric layers 241, 242, and 243 may be sequentially stacked on the first semiconductor chip 100. The first, second, and third photosensitive dielectric layers 241, 242, and 243 may be function as a single photosensitive dielectric layer.

As shown in FIGS. 12 and 13, the first redistribution pattern 210 may include an upper first redistribution pattern 211 and a lower first redistribution pattern 212 that are vertically stacked. The upper first redistribution pattern 211 may be in contact with the first power pad VP1 and the passivation layer 120. The lower first redistribution pattern 212 may be provided below the upper first redistribution pattern 211.

A portion of the upper first redistribution pattern 211 may be covered with or overlapped by the high-k dielectric pattern 250. The lower first redistribution pattern 212 may include a first via part V1 and a first line part L1 connected to the first via part V1. The upper first redistribution pattern 211 may have an exposed portion in contact with the first via part V1 of the lower first redistribution pattern 212.

The second redistribution pattern 220 may include an upper second redistribution pattern 221 and a lower second redistribution pattern 222 that are vertically stacked. The lower second redistribution pattern 222 may be provided below the upper second redistribution pattern 221.

The upper second redistribution pattern 221 may be in contact with the second power pad VP2, the passivation layer 120, and the high-k dielectric pattern 250. The upper second redistribution pattern 221 may be vertically spaced apart from the upper first redistribution pattern 211 across the high-k dielectric pattern 250. The lower second redistribution pattern 222 may include a second via part V2 and a second line part L2 connected to the second via part V2. The second via part V2 may be in contact with the upper second redistribution pattern 221. The second via part V2 may have a thickness H2 less that a thickness H1 of the first via part V1.

The third redistribution pattern 230 may include an upper third redistribution pattern 231 and a lower third redistribution pattern 232 that are vertically stacked. The lower third redistribution pattern 232 may be provided below the upper third redistribution pattern 231.

The upper third redistribution pattern 231 may be in contact with the signal pad IO and the first photosensitive dielectric layer 241. The lower third redistribution pattern 232 may include a third via part V3 and a third line part L3 connected to the third via part V3. The third via part V3 may be in contact with the upper third redistribution pattern 231. The third via part V3 may have a thickness H3 less that the thickness H1 of the first via part V1.

The external connection pads 260 may be correspondingly provided on the lower first, second, and third redistribution patterns 212, 222, and 232. The external connection terminals 270 may vertically overlap corresponding external connection pads 260. The external connection terminals 270 may be in contact with the corresponding external connection pads 260. The first semiconductor chip 100 may be provided on the lower redistribution substrate 200'.

The first semiconductor chip 100 may be, for example, a logic chip. The first semiconductor chip 100 may include a first semiconductor substrate 110 and a first passivation layer 120. The external connection terminals 270 may be electrically coupled to the first and second power pads VP1 and VP2 and the signal pad IO through the external connection pads 260 and the first, second, and third redistribution patterns 210, 220, and 230. The semiconductor package 3 may be a fan-out semiconductor package formed by a chip first process.

The conductive pillars 330 may be provided on the lower redistribution substrate 200' and in the first molding member 340. The conductive pillar 330 may be disposed laterally spaced apart from the first semiconductor chip 100. The conductive pillar 330 may be in contact with at least one selected from the first, second, and third redistribution patterns 210, 220, and 230. The conductive pillars 330 may be electrically connected through the first, second, and third redistribution patterns 210, 220, and 230 to the external connection terminal 270 and/or the first semiconductor chip 100. The conductive pillars 330 may include, for example, copper.

The first molding member 340 may be formed on and cover or overlap the lower redistribution substrate 200'. The first molding member 340 may expose top surfaces of the conductive pillars 330, while covering or overlapping sidewalls of the conductive pillars 330. The first molding member 340 may cover or overlap top and opposite lateral surfaces of the first semiconductor chip 100.

The upper redistribution substrate 400 may be disposed on a top surface of the first molding member 340 and the top surfaces of the conductive pillars 330.

The upper redistribution substrate 400 may include a fourth photosensitive dielectric layer 421, a fifth photosensitive dielectric layer 422, and an upper redistribution pattern 410. The fourth photosensitive dielectric layer 421 and the fifth photosensitive dielectric layer 422 may be substantially the same as the first, second, and third photosensitive dielectric layers 241, 242, and 243 discussed above. The upper redistribution pattern 410 may have a function substantially the same as that of the first, second, and third redistribution patterns 210, 220, and 230 discussed above. Bonding pads 430 may be provided on the upper redistribution pattern 410.

The second sub-semiconductor package PK2 may be provided on the upper redistribution substrate 400. The second sub-semiconductor package PK2 may include a package substrate 900, a second semiconductor chip 800, and a second molding member 840. The package substrate 900 may be a printed circuit board or a redistribution substrate. Metal pads 905 and 907 may be disposed on opposite surfaces of the package substrate 900.

The second semiconductor chip 800 may be a memory chip, such as DRAM or NAND Flash. The second semiconductor chip 800 may be of a different type from that of the first semiconductor chip 100. The second semiconductor chip 800 may include a second semiconductor substrate 810 and a second passivation layer 820. A chip pad 812 disposed on one surface of the second semiconductor substrate 810 may be wire-bonding connected to the metal pad 905 of the package substrate 900.

A connection terminal 834 may be disposed between the first sub-semiconductor package PK1 and the second sub-semiconductor package PK2. The connection terminal 834 may be in contact with the bonding pad 430 and the metal pad 907. The connection terminal 834 may be electrically connected to the bonding pad 430 and the metal pad 907. Therefore, the second sub-semiconductor package PK2 may be electrically connected to the first semiconductor chip 100 and the external connection terminal 270 through the upper redistribution substrate 400, the connection terminal 834, and the conductive pillar 330.

Figure 14:
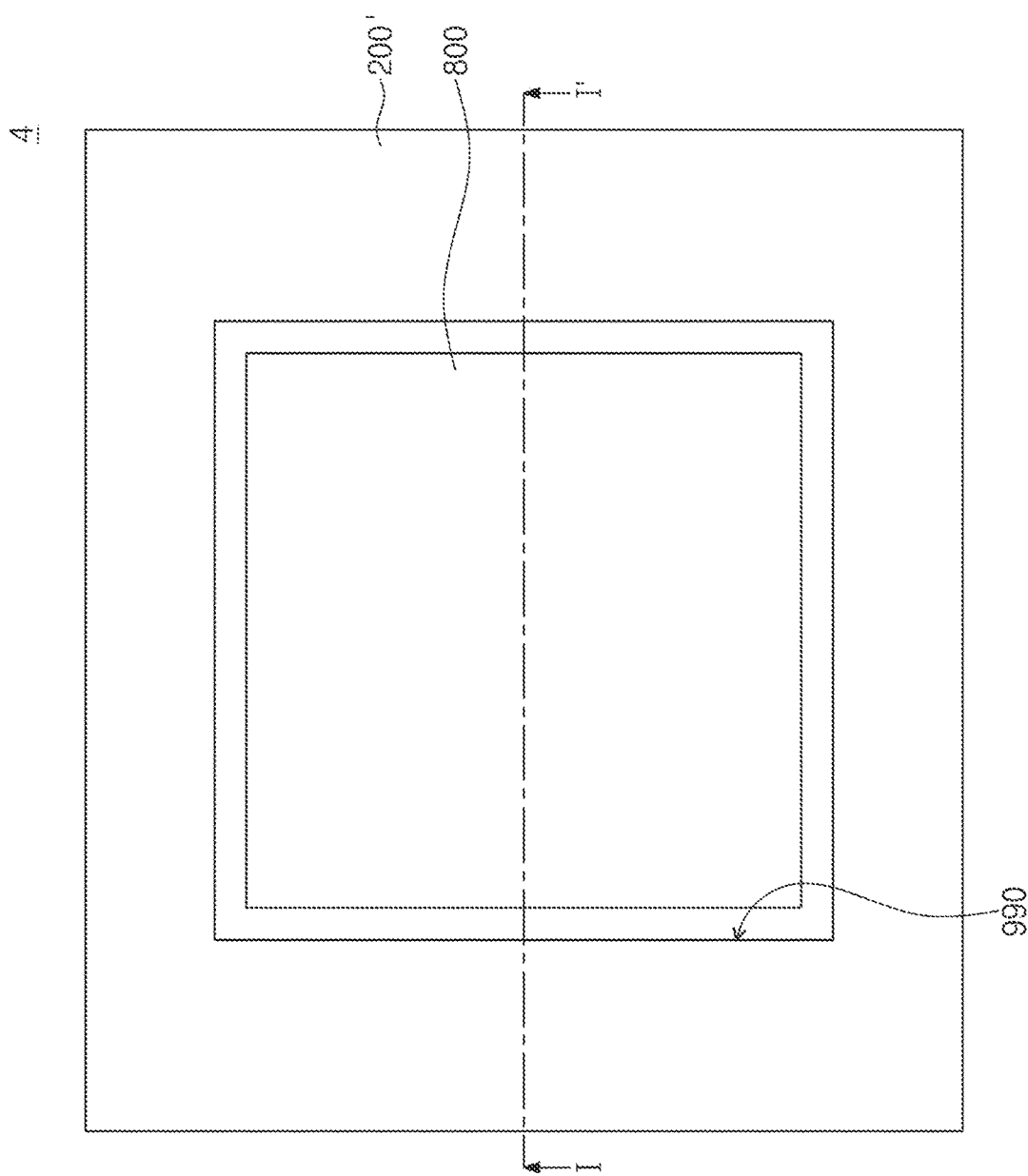
FIG. 14 illustrates a plan view showing a semiconductor package according to some embodiments of the present inventive concepts.
Figure 15:
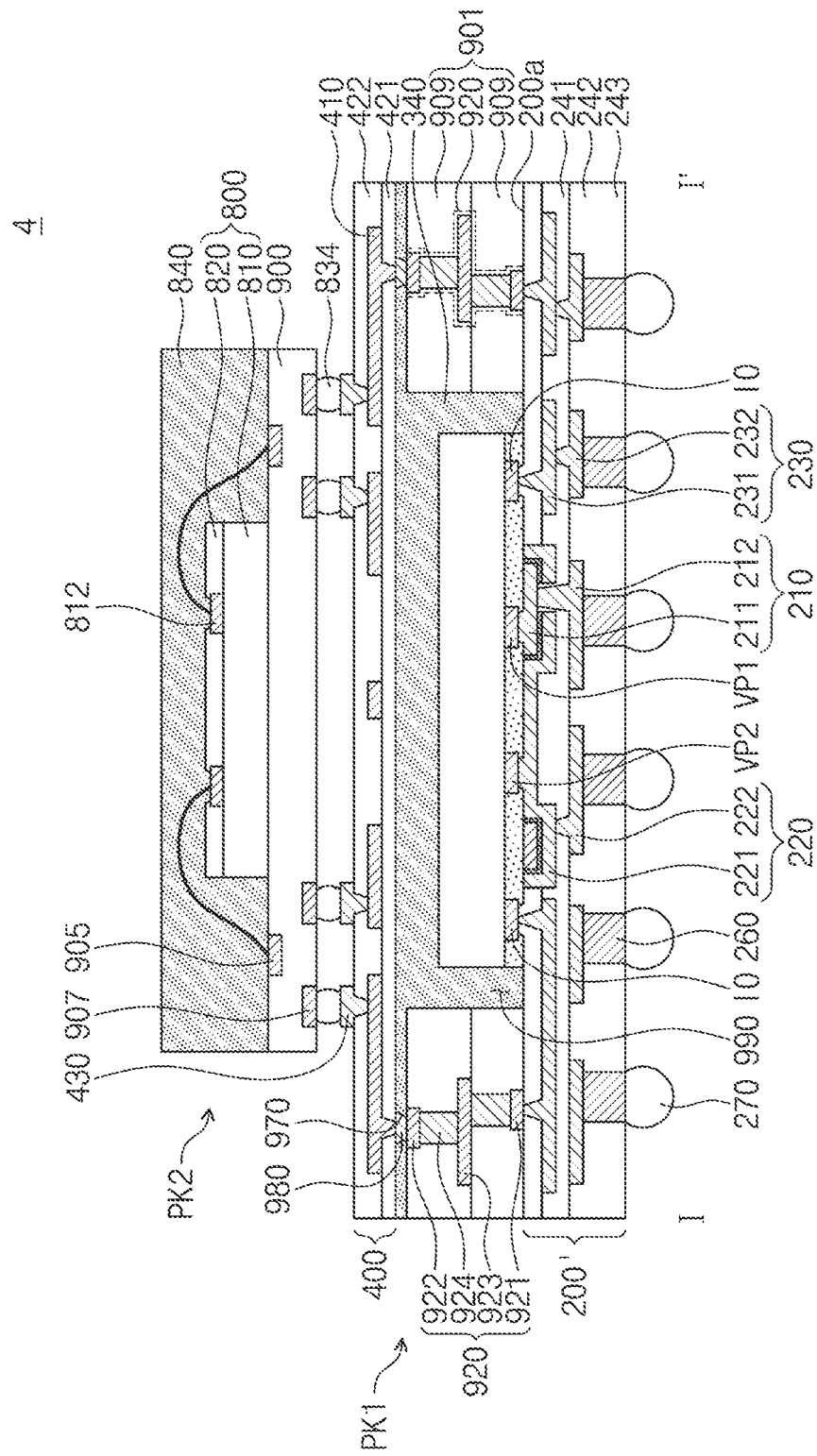
FIG. 15 illustrates a cross-sectional view taken along line I-I' of FIG. 14.

FIG. 14 illustrates a plan view showing a semiconductor package according to some embodiments of the present inventive concepts. FIG. 15 illustrates a cross-sectional view taken along line I-I' of FIG. 14. For clarity of configuration, FIG. 14 omits some components of FIG. 15. Omission will be made to avoid a repetitive description given with reference to FIG. 12.

Referring to FIGS. 14 and 15, a semiconductor package 4 according to some embodiments may include a first sub-semiconductor package PK1 including a connection substrate 901 and a second sub-semiconductor package PK2 on the first sub-semiconductor package PK1. The connection substrate 901 may be placed on a top surface 200a of the lower redistribution substrate 200'. The lower redistribution substrate 200' may include a capacitor including the first and second redistribution patterns 210 and 220 and the high-k dielectric pattern 250 as discussed in FIGS. 1 and 12.

The connection substrate 901 may have a hole 990 that penetrates therethrough. When viewed in plan, the hole 990 may be positioned on a central portion of the lower redistribution substrate 200'. The first semiconductor chip 100 may be provided in the hole 990. The connection substrate 901 may be provided on the lower redistribution substrate 200'. For example, the connection substrate 901 may be fabricated by forming the hole 990 in a printed circuit board. The connection substrate 901 may include base layers 909 and conductive structures 920.

The base layers 909 may include a dielectric material. For example, the base layers 909 may include a carbon-based material, a ceramic, or a polymer. The base layers 909 may include a different dielectric material from that of the first, second, and third photosensitive dielectric layers 241, 242, and 243 of the lower redistribution substrate 200'.

The hole 990 may penetrate the base layers 909. The conductive structure 920 may include a first pad 921, a conductive line 923, vias 924, and a second pad 922.

The first pad 921 may be provided on a bottom surface of the connection substrate 901. The conductive line 923 may be interposed between the base layers 909. The vias 924 may penetrate the base layers 909 and may be electrically coupled to the conductive line 923. The second pad 922 may be disposed on a top surface of the connection substrate 901 and may be coupled to one of the vias 924. The second pad 922 may be electrically connected to the first pad 921 through the vias 924 and the conductive line 923. The second pad 922 may not be aligned in a vertical direction with the first pad 921. The number or arrangement of the second pad 922 may be different from the number or arrangement of the first pad 921. The conductive structure 920 may include metal. The conductive structure 920 may include, for example, at least one selected from copper, aluminum, gold, lead, stainless steels, iron, and/or any alloy thereof.

The first molding member 340 may fill a gap between the first semiconductor chip 100 and the connection substrate 901. The first molding member 340 may be provided therein with an upper hole 970 that exposes the second pad 922 of the conductive structure 920. According to some embodiments, the upper hole 970 may be provided therein with a conductor 980 that fills the upper hole 970. The conductor 980 may include, for example, metal.

The upper redistribution substrate 400 may be provided on a top surface of the first molding member 340. The upper redistribution pattern 410 may be electrically connected to the conductor 980. The second sub-semiconductor package PK2 may be substantially the same as the second sub-semiconductor package PK2 discussed in FIG. 12.

According to the present inventive concepts, a semiconductor package may reduce its power noise by using a capacitor that includes, in a redistribution layer, redistribution patterns to which voltages are applied and includes a high-k dielectric pattern between the redistribution patterns. As a result, the semiconductor package may have improved reliability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a semiconductor chip; and
   a redistribution layer on a surface of the semiconductor chip,
   wherein the semiconductor chip comprises:
   a semiconductor substrate;
   a passivation layer between the semiconductor substrate and the redistribution layer; and
   a first power pad, a second power pad, and a signal pad that are in the passivation layer,
   wherein the redistribution layer comprises:
   a photosensitive dielectric layer; and
   a first redistribution pattern, a second redistribution pattern, a third redistribution pattern, and a high-k dielectric pattern, wherein the first redistribution pattern is electrically connected to the first power pad, the second redistribution pattern is electrically connected to the second power pad, the third redistribution pattern is electrically connected to the signal pad, and the high-k dielectric pattern is between the first redistribution pattern and the second redistribution pattern, wherein the photosensitive dielectric layer comprises a first dielectric material, wherein the high-k dielectric pattern comprises a second dielectric material, wherein a second dielectric constant of the second dielectric material is greater than a first dielectric constant of the first dielectric material, wherein the high-k dielectric pattern comprises a first portion that extends in a first direction that is perpendicular to and is separated from the semiconductor substrate and has an uppermost surface that is in direct contact with the passivation layer and comprises a second portion that extends in a second direction that is parallel to the semiconductor substrate, wherein the first portion and the second portion of the high-k dielectric pattern intersect such that the first portion and second portion form an L-shape, wherein the passivation layer comprises a third dielectric material that is different from the first dielectric material and the second dielectric material, and wherein the first redistribution pattern and the second redistribution pattern are in direct contact with the first portion of the high-k dielectric pattern.

2. The semiconductor package of claim 1, wherein the passivation layer comprises silicon nitride (SiNx).

3. The semiconductor package of claim 1,
wherein the first dielectric constant of the first dielectric material is less than about 4, and
wherein the second dielectric constant of the second dielectric material is greater than about 20.

4. The semiconductor package of claim 1, wherein the second dielectric material comprises one of hafnium dioxide ($HfO_2$), zirconium dioxide ($ZrO_2$), or yttrium oxide ($Y_2O_3$).

5. The semiconductor package of claim 1,
wherein the first power pad is electrically connected through the first redistribution pattern to a power source outside the semiconductor package,
wherein the second power pad is electrically connected through the second redistribution pattern to a ground outside the semiconductor package, and
wherein the signal pad is electrically connected through the third redistribution pattern to a circuit structure outside the semiconductor package.

6. The semiconductor package of claim 1, wherein the first redistribution pattern is configured to receive a first voltage that is different from a second voltage received by the second redistribution pattern.

7. The semiconductor package of claim 1, wherein the first dielectric material comprises at least one selected from photosensitive polyimide, polybenzoxazole, phenolic polymers, or benzocyclobutene polymers.

8. The semiconductor package of claim 1, wherein the first redistribution pattern and the second redistribution pattern are in contact with the passivation layer.

9. The semiconductor package of claim 1, wherein a thickness of the high-k dielectric pattern is less than or equal to about 1 µm.

10. A semiconductor package, comprising:
a semiconductor chip; and
a redistribution layer on a surface of the semiconductor chip,
wherein the semiconductor chip comprises:
a semiconductor substrate;
a passivation layer between the semiconductor substrate and the redistribution layer; and
a first power pad, a second power pad, and a signal pad that are in the passivation layer,
wherein the redistribution layer comprises:
a photosensitive dielectric layer; and
a first redistribution pattern, a second redistribution pattern, a third redistribution pattern, and a high-k dielectric pattern, wherein the first redistribution pattern is electrically connected to the first power pad, the second redistribution pattern is electrically connected to the second power pad, the third redistribution pattern is electrically connected to the signal pad, and the high-k dielectric pattern is between the first redistribution pattern and the second redistribution pattern,
wherein the photosensitive dielectric layer comprises a first dielectric material,
wherein the high-k dielectric pattern comprises a second dielectric material,
wherein a second dielectric constant of the second dielectric material is greater than a first dielectric constant of the first dielectric material,
wherein the third redistribution pattern comprises:
a via part in contact with the signal pad; and
a line part on the via part, wherein the line part extends parallel to the semiconductor chip and is vertically spaced apart from the signal pad and the passivation layer, and
wherein a distance between the line part and the passivation layer is greater than a thickness of the high-k dielectric pattern,
wherein the high-k dielectric pattern comprises a first portion that extends in a first direction that is perpendicular to and is separated from the semiconductor substrate and has an uppermost surface that is in direct contact with the passivation layer and comprises a second portion that extends in a second direction that is parallel to the semiconductor substrate,
wherein the first portion protrudes from the second portion toward the passivation layer such that the second portion of the high-k dielectric pattern is spaced apart from the passivation layer, and
wherein the first redistribution pattern and the second redistribution pattern are in direct contact with the first portion of the high-k dielectric pattern.

11. The semiconductor package of claim 10,
wherein the thickness of the high-k dielectric pattern is less than or equal to about 1 µm, and
wherein the distance between the line part and the passivation layer is greater than or equal to about 5 µm.

12. The semiconductor package of claim 10,
wherein the first redistribution pattern comprises:
an upper first redistribution pattern in contact with the first power pad; and
a lower first redistribution pattern below the upper first redistribution pattern relative to the semiconductor chip,
wherein the second redistribution pattern comprises:
an upper second redistribution pattern in contact with the second power pad; and
a lower second redistribution pattern below the upper second redistribution pattern relative to the semiconductor chip,
wherein the high-k dielectric pattern is in contact with a portion of the upper first redistribution pattern, wherein the upper second redistribution pattern is in contact with the high-k dielectric pattern, wherein the lower first redistribution pattern comprises:
 a first via part in contact with the upper first redistribution pattern; and
 a first line part connected to the first via part and spaced apart from the upper first redistribution pattern, wherein the lower second redistribution pattern comprises:
 a second via part in contact with the upper second redistribution pattern; and
 a second line part connected to the second via part and spaced apart from the upper second redistribution pattern, and wherein a thickness of the first via part is greater than a thickness of the second via part.

13. The semiconductor package of claim 10,
wherein the first dielectric material comprises at least one selected from photosensitive polyimide, polybenzoxazole, phenolic polymers, or benzocyclobutene polymers, and
wherein the second dielectric material comprises one of hafnium dioxide ($HfO_2$), zirconium dioxide ($ZrO_2$), or yttrium oxide ($Y_2O_3$).

14. The semiconductor package of claim 10,
wherein the passivation layer comprises silicon nitride (SiNx), and
wherein the high-k dielectric pattern is in contact with the passivation layer.

15. The semiconductor package of claim 10, wherein the first redistribution pattern is configured to receive a first voltage that is different from a second voltage received by the second redistribution pattern.

16. The semiconductor package of claim 12,
wherein the high-k dielectric pattern is in contact with a sidewall of the first via part of the lower first redistribution pattern.

17. A semiconductor package, comprising:
a first sub-package; and
a second sub-package on the first sub-package,
wherein the first sub-package comprises:
 a lower redistribution substrate;
 a semiconductor chip on the lower redistribution substrate;
 an upper redistribution substrate vertically spaced apart from the lower redistribution substrate and on an opposite side of the semiconductor chip; and
 a conductive pillar between the lower redistribution substrate and the upper redistribution substrate,
wherein the semiconductor chip comprises:
 a semiconductor substrate;
 a passivation layer between the semiconductor substrate and the lower redistribution substrate; and
 a first power pad, a second power pad, and a signal pad that are in the passivation layer,
wherein the lower redistribution substrate comprises:
 a photosensitive dielectric layer; and
 a first redistribution pattern, a second redistribution pattern, a third redistribution pattern, and a high-k dielectric pattern, wherein the first redistribution pattern is electrically connected to the first power pad, the second redistribution pattern is electrically connected to the second power pad, the third redistribution pattern is electrically connected to the signal pad, and the high-k dielectric pattern is between the first redistribution pattern and the second redistribution pattern, wherein the photosensitive dielectric layer comprises a first dielectric material,
wherein the high-k dielectric pattern comprises a second dielectric material,
wherein a second dielectric constant of the second dielectric material is greater than a first dielectric constant of the first dielectric material,
wherein the first redistribution pattern comprises:
 an upper first redistribution pattern in contact with the first power pad; and
 a lower first redistribution pattern below the upper first redistribution pattern relative to the semiconductor chip,
wherein the second redistribution pattern comprises:
 an upper second redistribution pattern in contact with the second power pad; and
 a lower second redistribution pattern below the upper second redistribution pattern relative to the semiconductor chip,
wherein the high-k dielectric pattern overlaps a portion of the upper first redistribution pattern,
wherein the upper second redistribution pattern overlaps the high-k dielectric pattern,
wherein the lower first redistribution pattern comprises:
 a first via part in contact with the upper first redistribution pattern; and
 a first line part connected to the first via part and spaced apart from the upper first redistribution pattern,
wherein the lower second redistribution pattern comprises;
 a second via part in contact with the upper second redistribution pattern; and
 a second line part connected to the second via part and spaced apart from the upper second redistribution pattern, and
wherein a thickness of the first via part is greater than a thickness of the second via part.

18. The semiconductor package of claim 17,
wherein the first power pad is electrically connected through the first redistribution pattern to a power source outside the semiconductor package,
wherein the second power pad is electrically connected through the second redistribution pattern to a ground outside the semiconductor package, and
wherein the signal pad is electrically connected through the third redistribution pattern to a circuit structure outside the semiconductor package.

19. The semiconductor package of claim 17,
wherein the first dielectric material comprises at least one selected from photosensitive polyimide, polybenzoxazole, phenolic polymers, or benzocyclobutene polymers,
wherein the second dielectric material comprises one of hafnium dioxide ($HfO_2$), zirconium dioxide ($ZrO_2$), or yttrium oxide ($Y_2O_3$), and
wherein the passivation layer comprises silicon nitride (SiNx).

20. The semiconductor package of claim 17,
wherein the third redistribution pattern comprises a third via part in contact with the signal pad and a third line part on the third via part,
wherein the third line part is vertically spaced apart from the signal pad and the passivation layer, and
wherein a distance between the third line part and the passivation layer is greater than a thickness of the high-k dielectric pattern.

* * * * *